(12) United States Patent
Kephart

(10) Patent No.: US 9,340,931 B2
(45) Date of Patent: May 17, 2016

(54) METHOD AND SYSTEM FOR IN-SITU CROSS LINKING OF POLYMERS, BITUMEN AND SIMILAR MATERIALS TO INCREASE STRENGTH, TOUGHNESS AND DURABILITY VIA IRRADIATION WITH ELECTRON BEAMS FROM MOBILE ACCELERATORS

(71) Applicant: Fermi Research Alliance, LLC, Batavia, IL (US)

(72) Inventor: Robert D. Kephart, Elburn, IL (US)

(73) Assignee: Fermi Research Alliance, LLC, Batavia, IL (US)

( * ) Notice: Subject to any disclaimer, the term of this patent is extended or adjusted under 35 U.S.C. 154(b) by 0 days.

(21) Appl. No.: 14/942,606

(22) Filed: Nov. 16, 2015

(65) Prior Publication Data

US 2016/0069030 A1    Mar. 10, 2016

Related U.S. Application Data

(63) Continuation-in-part of application No. 14/022,365, filed on Sep. 10, 2013, now Pat. No. 9,186,645.

(51) Int. Cl.

| | |
|---|---|
| *E01C 7/06* | (2006.01) |
| *E01C 11/00* | (2006.01) |
| *E01C 7/30* | (2006.01) |
| *E01C 7/35* | (2006.01) |
| *E01C 9/00* | (2006.01) |
| *E01C 23/03* | (2006.01) |
| *E01C 23/14* | (2006.01) |
| *H01J 37/06* | (2006.01) |
| *H01J 37/305* | (2006.01) |

(52) U.S. Cl.
CPC ............... *E01C 11/005* (2013.01); *E01C 7/30* (2013.01); *E01C 7/356* (2013.01); *E01C 9/001* (2013.01); *E01C 23/03* (2013.01); *E01C 23/14* (2013.01); *H01J 37/06* (2013.01); *H01J 37/305* (2013.01)

(58) Field of Classification Search
CPC ........... E01C 7/30; E01C 7/356; E01C 9/001; E01C 11/005; E01C 23/03; E01C 23/14; H01J 37/06; H01J 37/305
USPC ................................................ 404/77, 79, 95
See application file for complete search history.

(56) References Cited

U.S. PATENT DOCUMENTS

| | | |
|---|---|---|
| 6,713,540 B2 | 3/2004 | Rached et al. |
| 6,753,478 B2 | 6/2004 | Rodway et al. |

(Continued)

FOREIGN PATENT DOCUMENTS

| | | |
|---|---|---|
| EP | 0 731 232 A2 | 9/1996 |
| EP | 1 645 587 A1 | 4/2006 |

(Continued)

*Primary Examiner* — Raymond W Addie
(74) *Attorney, Agent, or Firm* — Kevin Soules; Kermit D. Lopez; Luis M. Ortiz

(57) ABSTRACT

A method and system for treating and strengthening material filling a pothole. One or more electron accelerators can be integrated with a mobile unit. The electron accelerators are positioned on the mobile unit to heat, irradiate and treat in-situ, both the base material and a material filling a pothole located proximate to the mobile unit, wherein irradiation of the material by the electron accelerators results in in-situ cross-linking or polymerization of the material and therefore a strengthening and increased durability of the material filling the pothole. Deep heating of the substrate allows pothole repair even under extreme low temperature winter conditions. The in-situ treatment of the material filling the pothole in a road surface to toughens and strengthens the road surface and the filled pothole which results in improved material properties of the surface, enhanced durability, and improved lifetime of the pothole fill.

9 Claims, 5 Drawing Sheets

(56) References Cited

U.S. PATENT DOCUMENTS

| | | |
|---|---|---|
| 8,198,350 B2 | 6/2012 | Fee et al. |
| 8,277,738 B2 | 10/2012 | Kim et al. |
| 8,389,642 B2 | 3/2013 | Goto et al. |
| 2011/0081553 A1 | 4/2011 | Mehlmann et al. |
| 2012/0295048 A1 | 11/2012 | Al-Malaika et al. |
| 2013/0316087 A1 | 11/2013 | Ahn et al. |
| 2014/0270955 A1 | 9/2014 | Coe |

FOREIGN PATENT DOCUMENTS

| | | |
|---|---|---|
| EP | 1 396 580 B1 | 6/2006 |
| EP | 1 690 702 B1 | 5/2012 |

METHOD AND SYSTEM FOR IN-SITU CROSS LINKING OF POLYMERS, BITUMEN AND SIMILAR MATERIALS TO INCREASE STRENGTH, TOUGHNESS AND DURABILITY VIA IRRADIATION WITH ELECTRON BEAMS FROM MOBILE ACCELERATORS

CROSS REFERENCE TO RELATED APPLICATIONS

This patent application is a continuation-in-part of U.S. patent application Ser. No. 14/022,365, titled "METHOD AND SYSTEM FOR IN-SITU CROSS LINKING OF POLYMERS, BITUMEN AND SIMILAR MATERIALS TO INCREASE STRENGTH, TOUGHNESS AND DURABILITY VIA IRRADIATION WITH ELECTRON BEAMS FROM MOBILE ACCELERATORS," filed on Sep. 10, 2013. This patent application claims the priority and benefit of U.S. patent application Ser. No. 14/022,365. U.S. patent application Ser. No. 14/022,365 is herein incorporated by reference in its entirety.

TECHNICAL FIELD

Embodiments are generally related to electron accelerators. Embodiments are also related to the cross-linking of materials such as synthetic polymer. Embodiments additionally relate to methods and systems for rapid and deep pre-heating of surfaces, surface preparation, treating, and strengthening materials used to fill potholes.

BACKGROUND

An electron accelerator refers generally to a type of apparatus capable of accelerating electrons generated from an electron gun in a vacuum condition through a high voltage generator or RF structure to impart increased energy to the electron, and diffusing the electrons so as to emit electron beams having high energy close to the speed of light through a beam extraction device so that the electrons are extracted from the vacuum condition and can be caused to impinge on a target object.

The electron accelerator accelerates the electrons generated from the electron gun and emits the electron beams having a regular width while scanning in a scan coil in the beam extraction device so as to cause the electron beams to irradiate a target object in a controlled fashion.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide for an improved method and system for rapid and deep pre-heating of material surfaces, surface preparation, treating, and strengthening materials.

It is another aspect of the disclosed embodiments to provide for the use of electron accelerators for modifying the mechanical properties of materials.

It is yet another aspect of the disclosed embodiments to provide for the in-situ cross-linking of polymers, bitumen, and similar materials to increase the strength, toughness, and durability via irradiation with electron beams from mobile accelerators.

It is a further aspect of the disclosed embodiments to provide for the use of electron beams from mobile accelerators to irradiate material such as a finished road surface or a road surface repair patch to increase its durability and extend its useful life by adjusting the materials properties of the utilized binding material in-situ and after forming via radiation induced cross-linking or polymerization.

The aforementioned aspects and other objectives and advantages can now be achieved as described herein. Methods and systems for the rapid and deep pre-heating of a material surface and for treating and strengthening material filling potholes are described herein. In an example embodiment, one or more electron accelerators can be integrated with a mobile unit. The electron accelerators are positioned on the mobile unit to irradiate and treat in-situ, both the base material to raise its temperature and a material filling a pothole located proximate to the mobile unit, wherein irradiation of the base surface serves to heat the material to promote a good bond with repair material. Irradiation of a material filling the pothole results in in-situ cross-linking or polymerization of the material strengthening and increasing durability of the material filling the pothole. This approach allows for the high quality repair of potholes even under extreme low temperature winter conditions and/or with or without in-situ cross-linking of the repair material.

BRIEF DESCRIPTION OF THE FIGURES

The accompanying figures, in which like reference numerals refer to identical or functionally similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

U.S. patent application Ser. No. 14/022,365, titled "METHOD AND SYSTEM FOR IN-SITU CROSS LINKING OF POLYMERS, BITUMEN AND SIMILAR MATERIALS TO INCREASE STRENGTH, TOUGHNESS AND DURABILITY VIA IRRADIATION WITH ELECTRON BEAMS FROM MOBILE ACCELERATORS," filed on Sep. 10, 2013 describes systems and methods for treating and strengthening a material, the systems and methods comprising a mobile unit, an electron gun that emits a beam of electrons, an electron accelerator integrated with the mobile unit that is positioned to accelerate the beam of electrons, and a beam extraction device comprising a scan coil that emits the accelerated beam of electrons, where the beam extracting device is positioned on the mobile unit to irradiate the surface of, and treat in-situ, a material located proximate to the mobile unit, wherein irradiation of the material by the beam of electrons results in in-situ cross-linking of the material and therefore a strengthening and increased durability of the material. U.S. patent application Ser. No. 14/022,365 is herein incorporated by reference in its entirety.

Figure 1:
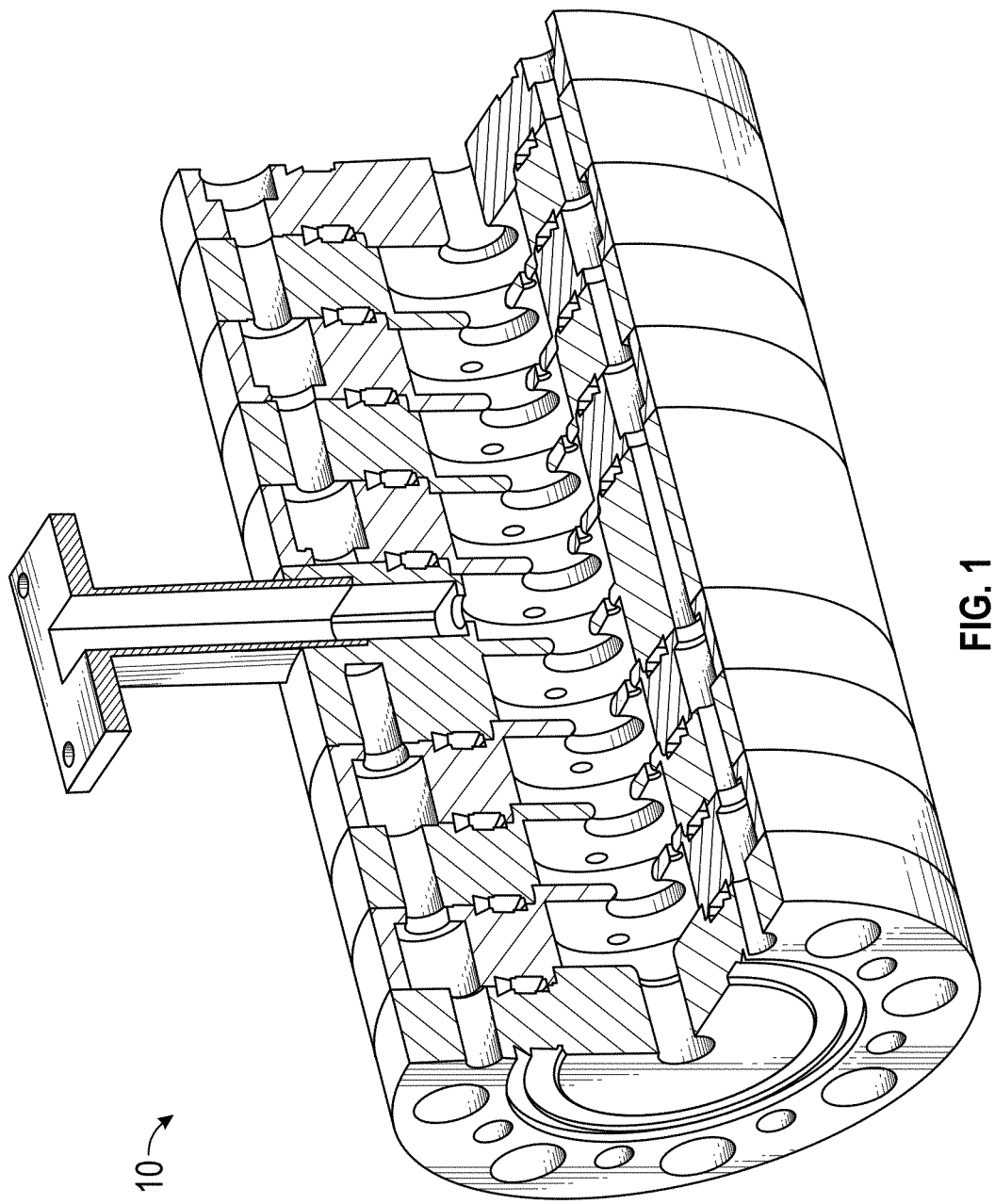
FIG. 1 illustrates a perspective cut-away view of RF structures that can form elements of an electron accelerator that can be adapted for use in accordance with a preferred embodiment.

FIG. 1 illustrates a perspective cut-away view of an RF structure 10 that can form elements of an electron accelerator that can be adapted for use in accordance with a preferred embodiment. Note that RF accelerator and electron gun structures based on copper can be employed to produce electron beams of the required energy for implementation of the disclosed embodiments. An electron accelerator, for example, that employs the RF structure 10 can accelerate electrons generated from an electron gun with RF electric fields in resonant cavities sequenced such that the electrons are accelerated due to an electric field present in each cavity as the electron traversed the cavity to reach a beam extraction device.

Figure 2:
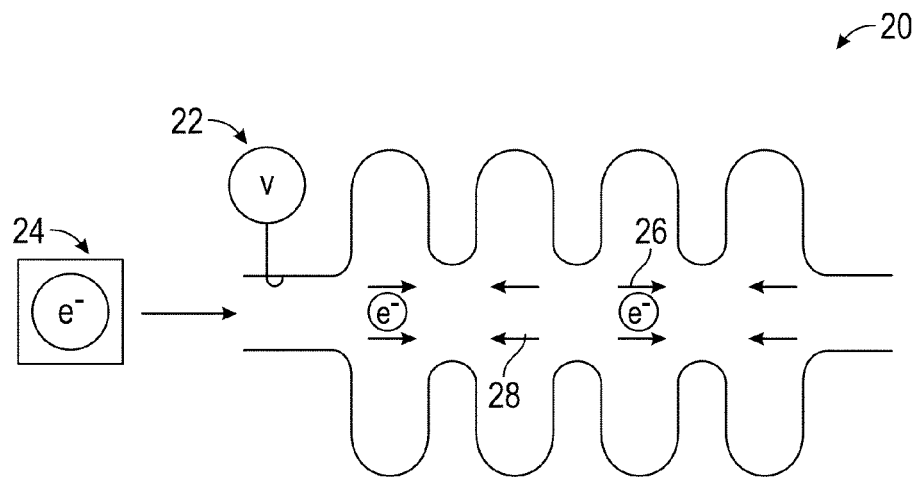
FIG. 2 illustrates a perspective cut-away view of a superconducting RF structure that can also form elements of an electron accelerator adapted for use in accordance with a preferred embodiment. The figure indicates the operating principles of such an elliptical RF cavity.

FIG. 2 illustrates a perspective cut-away view of a four cell elliptical superconducting RF structure 20 that can also form elements of an electron accelerator adapted for use in accordance with a preferred embodiment. Note that varying embodiments can employ alternative cavity geometries and/or cell numbers. FIG. 2 generally indicates the operating principles of an elliptical RF cavity. Advancements in SRF technology can enable even more compact and efficient accelerators for this application.

The RF structure 20 of FIG. 2 demonstrates the principle of operation in which alternating RF electric fields can be arranged to accelerate groups of electrons timed to arrive in each cavity when the electric field in that cavity causes the electrons to gain additional energy. In the particular embodiment shown in FIG. 2, a voltage generator 22 can induce an electric field within the RE cavity. Its voltage can oscillate, for example, with a radio frequency of 1.3 Gigahertz or 1.3 billion times per second. An electron source 24 can inject particles into the cavity in phase with the variable voltage provided by the voltage generator 22 of the RF structure 20. Arrow(s) 26 shown in FIG. 2 indicate that the electron injection and cavity RE phase is adjusted such that electrons experience or "feel" an average force that accelerates them in the forward direction, while arrow(s) 28 indicate that electrons are not present in a cavity cell when the force is in the backwards direction.

It can be appreciated that the example RE structures 10 and 20, respectively shown in FIGS. 1-2, represent examples only and that electron accelerators of other types and configurations/structures/frequencies may be implemented in accordance with alternative embodiments. That is, the disclosed embodiments are not limited structurally to the example electron accelerator structures 10, 20, respectively shown in FIGS. 1-2, but represent merely one possible type of structures that may be employed with particular embodiments. Alternative embodiments may vary in structure, arrangement, frequency, and type of utilized accelerators, RF structures, and so forth.

Figure 3:
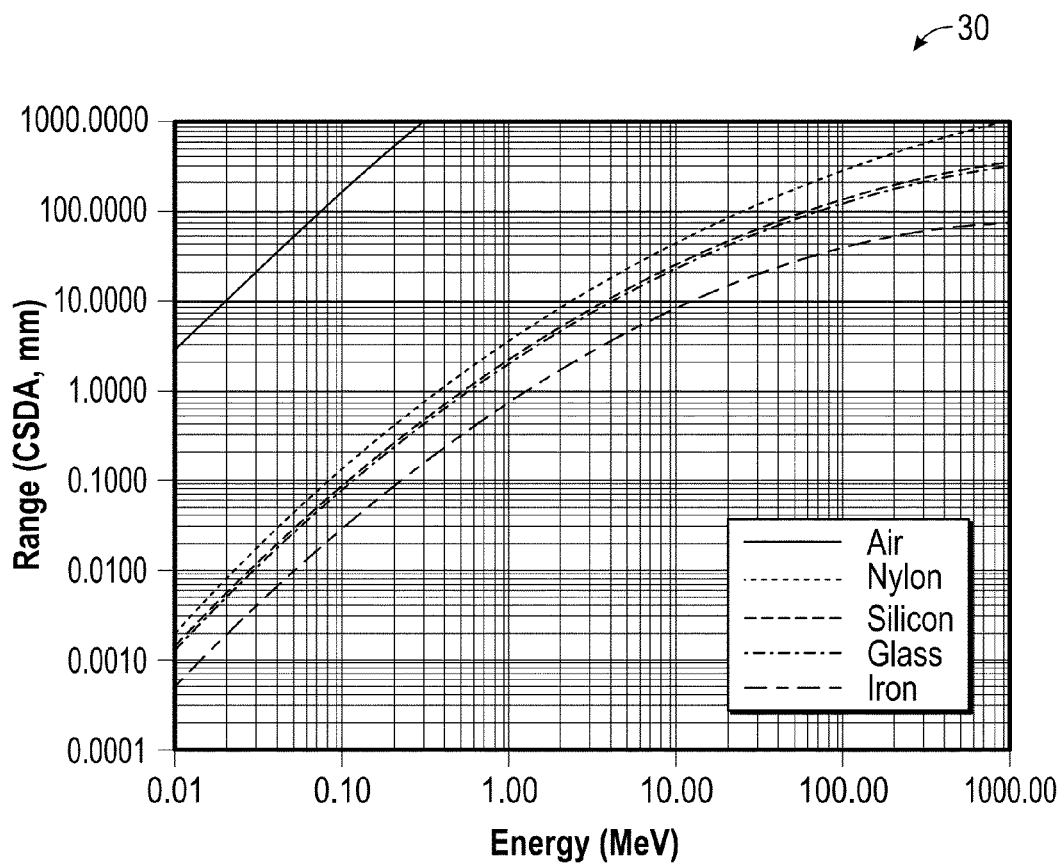
FIG. 3 illustrates a graph depicting the results of depth of electron beam treatment vs. the electron beam energy with respect to various material types.

FIG. 3 illustrates a graph 30 depicting data indicative of the depth of electron beam treatment achievable with respect to various energy electrons and material types. It can be appreciated that many chemical binding agents can be cross-linked. For asphalt road construction and pothole repair, an ideal agent should be cost competitive with bitumen and have similar properties so that existing road equipment can be used at similar construction and repair costs. In other applications, or if sufficient longevity of the surface can be achieved, this requirement can be relaxed. In a post road fabrication and repair treatment system, mobile accelerators (vehicle mounted) can provide electron beams to deeply preheat the existing road surface promoting good adhesion of repair material even under extreme low temperature winter conditions, and/or to crosslink binders in bitumen or other binding agents to create an asphalt-like material (for example, to fill a pothole) with improved service lifetime. Note that the IAEA limits for industrial EB (Electron Beam) processing are <10 MeV limited by neutron activation. The range of 10 MeV electron is ~20 mm in silicon, but should be longer in asphalt since it is a mixture of gravel (e.g., Silicon dioxide, Calcium carbonate, etc.) and bitumen (e.g., $CH_2$) as indicated by the graph shown in FIG. 3.

Figure 4:
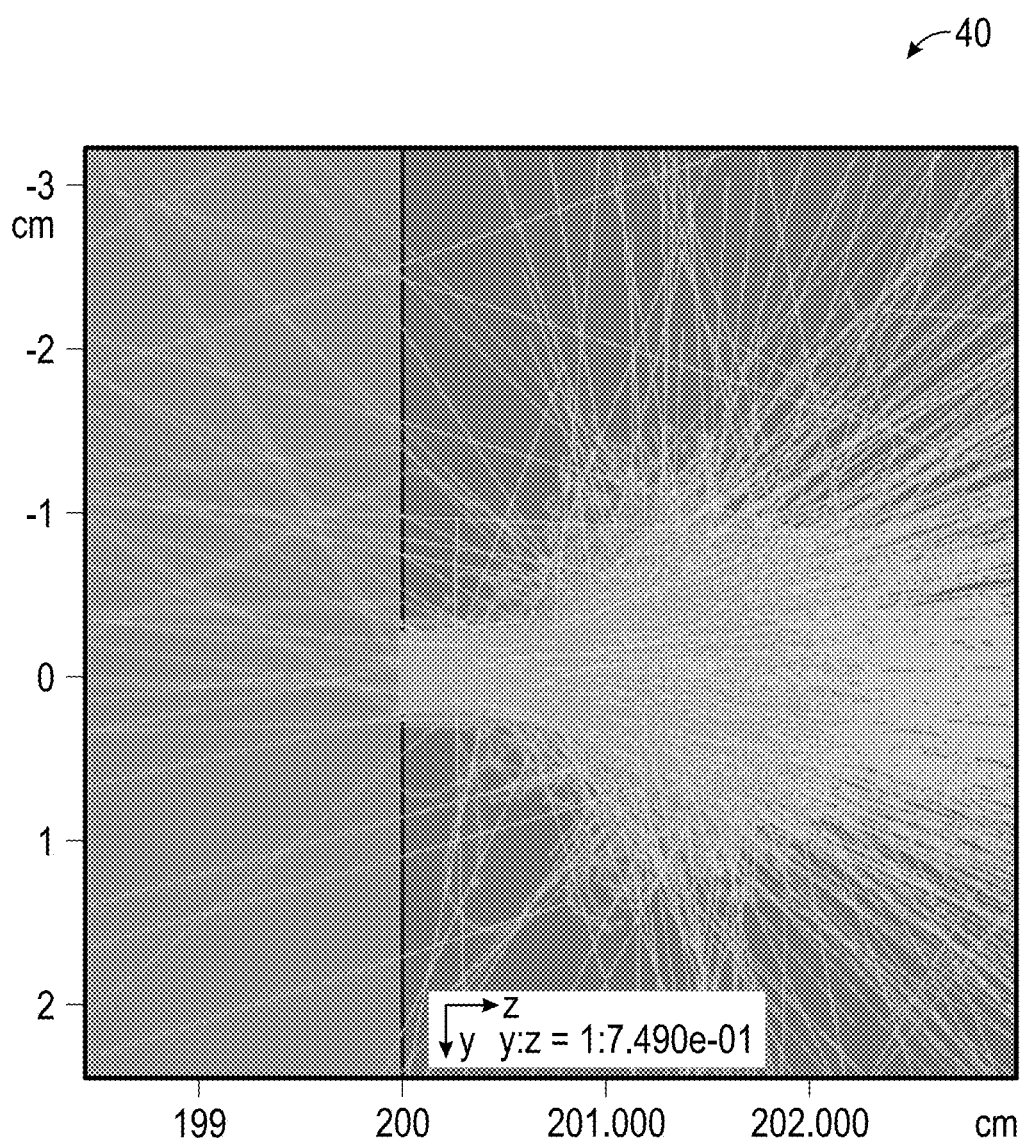
FIG. 4 illustrates the results of simulation of a 10 MeV electron beam on a material simulating a road surface indicating that electrons penetrate to the required depth and that additional x-rays are produced that can enable polymerization and cross-linking to even larger depths than reached by the electrons.
Figure 5:
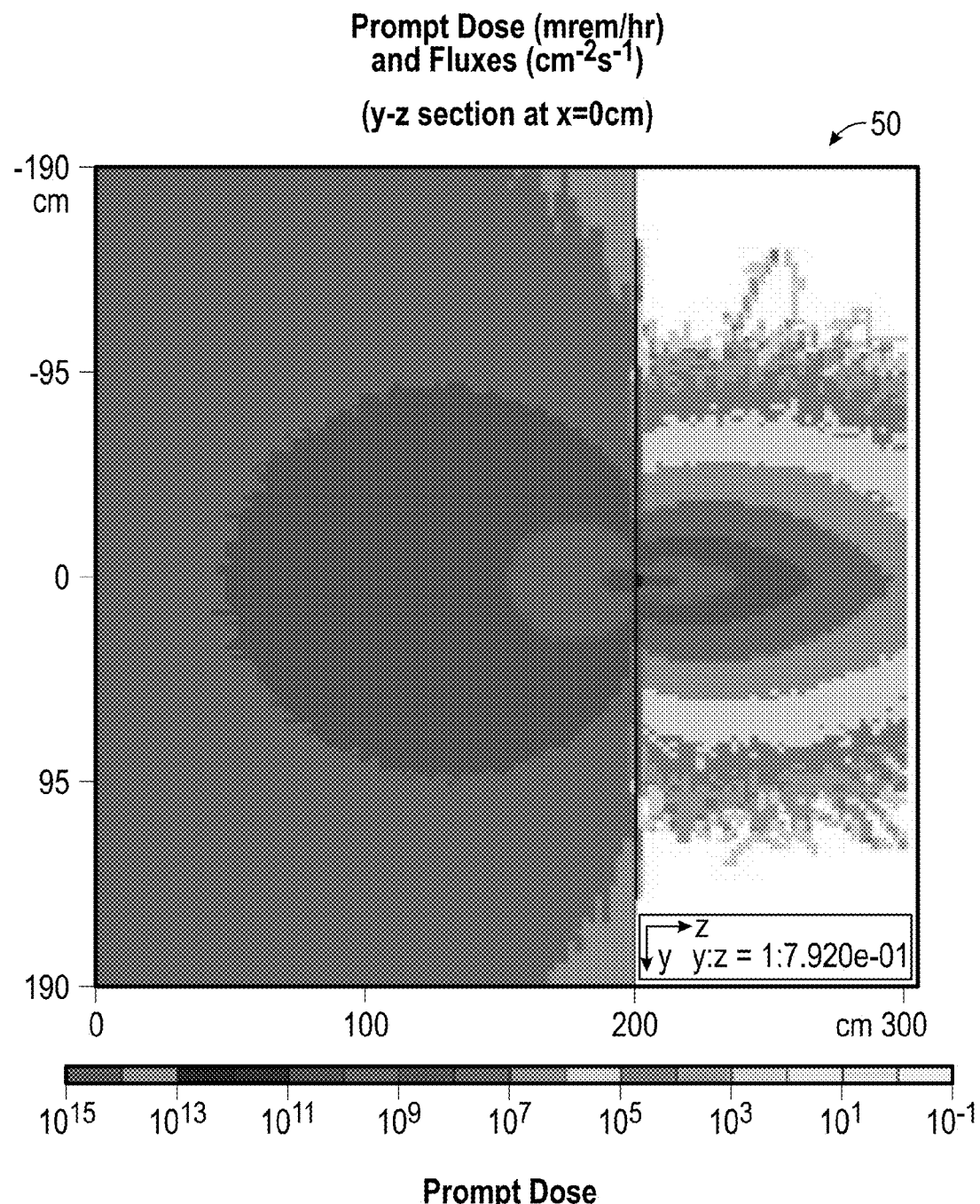
FIG. 5 illustrates the results of simulation of a 10 MeV electron beam on material simulating a road surface indicating that the required doses for cross-linking can be obtained with practical EB accelerators.

FIGS. 4 and 5 illustrate respective graphs 40 and 50, which indicate the results of a Monte Carlo simulation of 10 MeV electrons on a material simulating the surface of an asphalt road or the fill in a pothole repair, in accordance with the disclosed embodiments. Graph 40 of FIG. 4, for example, depicts data confirming the conclusion that the required electron penetration depth can be achieved. X-rays produced in this process can extend cross-linking of binders to depths beyond the range of the electrons such that x-ray driven cross-linking should be considered as an additional embodiment of this method.

FIG. 5 illustrates graph 50, which indicates the simulated dose distribution from a 10 MeV electron, which can allow those skilled in the art to conclude that the required doses for polymerization and/or cross-linking can be achieved with accelerators of practical energies and beam power outputs. Graph 50 shown in FIG. 5 can also be used to demonstrate that the required level of shielding can be achieved to protect workers from radiation hazards during operations.

Note that the typical cross-linking dose for plastics, wires, covering requires ~200 kGy. One gray (Gy) is one joule per kilogram of deposited energy. The power required can be, for example, 200,000 J/Kg×volume/sec×density (Kg/M3). Assuming an irradiated volume/sec=30 mm thick×4 M wide× 0.025 M/sec, the travel rate of a machine across a road can be calculated as: (→1.5 Meters per minute, 90 M per hour→>mile per day) with volume/sec=0.003 M3/sec=0.003×106 cm3/sec=0.003×10**3 liters per second; 3 liters per sec→7.5 kg/sec (Assume density=2.5); and power required=200,000 J/kg×7.5 kg/sec=1.5 MW total beam power. For a 4M wide road surface, for example, this can be divided into 4 EB machines each of ~400 KW each. From this calculation, one can conclude that this is in a plausible range for mobile electron accelerators. It is possible and even likely that binders requiring smaller doses for cross-linking can be developed allowing either lower beam powers or higher material processing speeds.

FIG. 4 thus illustrates graph 40 depicting the results of simulation of a 10 MeV electron beam on a material simulating a road surface indicating that electrons penetrate to the required depth and that additional x-rays are produced that can enable polymerization and cross-linking to even larger depths than reached by the electrons.

FIG. 5 illustrates graph 50 depicting the results of simulation of a 10 MeV electron beam on material simulating a road surface or pothole repair indicating that the required doses for cross-linking can be obtained with practical EB (Electron Beam) accelerators. Separate calculations based on this simulation indicate that the device can be adequately shielded to protect nearby workers.

Figure 6:
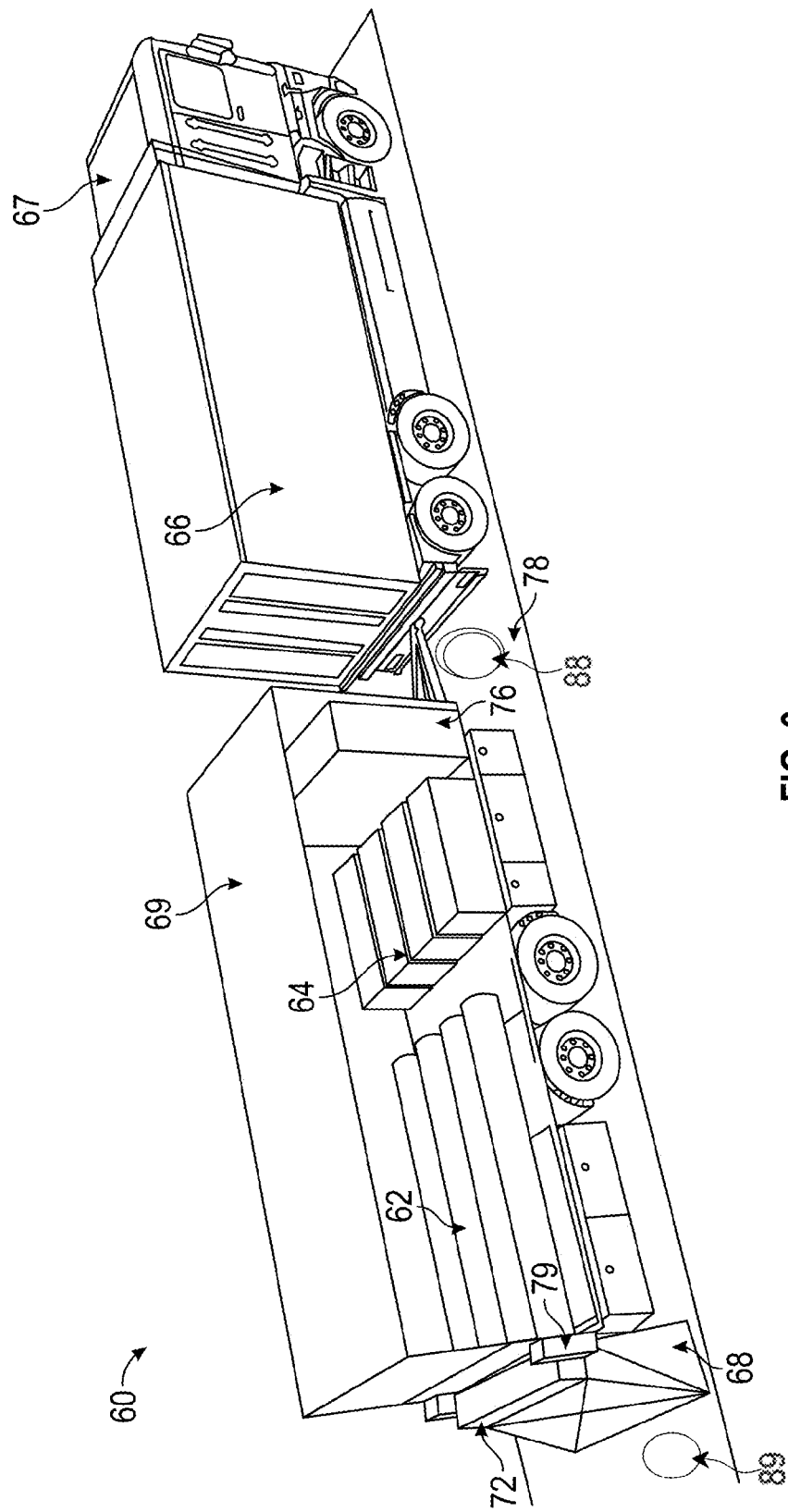
FIG. 6 illustrates a system for treating and strengthening a material, in accordance with a preferred embodiment.

FIG. 6 illustrates a system 60 for treating and strengthening a material, in accordance with a preferred embodiment. System 60 generally includes a mobile unit 69 (e.g., a trailer) capable of being pulled by, for example, a truck 67 or other vehicle. The truck 67 carries a mobile electrical generator 66. One or more electron accelerators 62 can be disposed within the trailer with respect to one or more RF sources 64. A cooling structure 76 can also be located within the trailer or mobile unit 69 with respect to the RF source 64. In a preferred embodiment, the accelerators 62, RF sources 64, and cooling structure 76 can be integrated with the mobile unit 69.

A shielding 68 can be located at the rear of the mobile unit 69 to enclose electron beams with respect to the electron accelerator(s) 62. In addition; a structure 72 for EB bending and sweeping magnets can also be located at the rear of the mobile unit 69. A mechanism can also be provided to follow the road surface 78 with potholes 88. The electron accelerators 62 can be positioned on the mobile unit 69 to irradiate and treat in-situ, a material filling a pothole 88 (e.g., a road surface 78) located proximate to the mobile unit 69, wherein irradiation of the material filling the pothole 88 via the electron accelerators 62 results in in-situ polymerization and/or cross-linking of the material and therefore a strengthening and increased durability of the material filling the repaired pothole 89.

In some embodiments, the material filling the pothole to be irradiated may constitute a polymer or a polymer composite. In other embodiments, such material can be, for example, a bitumen or modified bitumen, or an electron or x-ray cross-link capable bitumen product. In still other embodiments, the material can be, for example, plastic or plastic composite materials or any material capable of being cross-linked or its materials properties modified with Electron Beams or X-ray or by irradiation of the material to induce in-situ cross-linking or curing of the material.

In still other embodiments, the material filling the pothole may be, for example, asphalt, modified asphalt, or a cross-link capable binder-stone mixture of a road surface. In a preferred embodiment, material is such a road surface. In general, the mobile unit can be configured as a vehicle-mounted unit that moves above and with respect to the pothole in the road surface/material filling the pothole. The mobile unit moves with respect to the material filling the pothole that is being treated.

In another embodiment, the system 60 can include a mobile electron accelerator 62 that is used to accelerate electrons into the surface of a pothole 88 in a road surface that has been filled with repair material. The accelerated electrons rapidly raise the temperature of the repair or fill material (usually asphalt) above the melting point of the binder (usually bitumen) to a necessary depth below the surface of the repair. This allows a lasting hot patch repair to be made that achieves adhesion and compaction quality that improves the durability and life of the repaired pothole 89 in road 78. Such patches may be made even in cold winter weather, and result in a comparable repair to repairs performed in warm weather. The technique for repairing a pothole 88 can also be combined with a patch material that can be electron beam cross-linked to provide extra strength for the pothole repair.

One of the key aspects of the disclosed embodiments is based on the realization that the material properties of polymers, for example, can be improved (e.g., strength, toughness, heat resistance, etc.) via cross-linking the material with radiation. The mobile electron accelerators 62 and/or providing the electron beams can provide such irradiation.

When a synthetic polymer is to be "cross-linked," this refers to a process in which a portion of, or the entire bulk of the polymer has been exposed to the cross-linking method. The disclosed approach exposes the polymer to radiation from the electron accelerator(s). This resulting modification of mechanical properties depends strongly on the cross-link density achieved. Low cross-link densities decrease the viscosities of polymeric fluids. Intermediate cross-link densities transform gummy polymers into materials that have elastomeric properties and potentially high strengths. Additional cross-linking makes the material more rigid and eventually stiff and brittle. Radiation induced polymerization allows in-situ adjustment of such materials properties.

Numerous polymers can be added to bitumen to create mixtures that, when cross-linked, alter their physical properties. Bitumen mixtures of this type can be cross-linked, usually with the addition of sulfur compounds. All such methods must be performed beforehand therefore coupling the handling properties of the materials during fabrication to the eventual properties of the completed item.

The disclosed embodiments, on the other hand, can employ electron beams from mobile accelerators such as, for example, accelerators to irradiate material such as a finished road surface or a repaired pothole to increase the durability and extend the useful life by adjusting the materials properties of the binding material (e.g., polymer) in-situ and after forming via radiation induced cross-linking. Such an approach can be used to tailor the final materials properties to the intended application independent of the materials properties during formation of the surface. It should be appreciated, however, that such an approach is not limited to road surfaces and pothole repair, but can be adapted for use in irradiating other finished in-place materials to increase toughness, durability, and heat resistance.

The embodiments described herein provide electron beams that are very effective at depositing heat deep (several centimeters or more) into a surface allowing its temperature to be raised to the standard working temperatures for asphalt even under conditions of extreme winter cold. Electron beam heating described herein is fundamentally different than prior art surface heating methods such as flaming because electron beams do not depend on the thermal conductivity of an asphalt like material, which is typically very poor, to heat subsurface material.

The embodiment depicted in FIG. 6 can be implemented in the context of standard asphalt construction and repair involving the use of gravel and bitumen. Once completed, a road surface or pothole repair constructed of standard bitumen-gravel material has limited durability due to the poor materials properties of the bitumen. It shrinks and cracks when exposed to cold temperatures and loads and becomes less flexible with age. Repeating thermal cycles in the presence of water can also cause the surface to deteriorate. This can lead to a constant requirement to resurface roads, particularly in cold climates. Nationally, road resurfacing and pothole repair requires enormous expenditures of public funds, energy, and labor. If instead the road were fabricated using a gravel and binder mix with the binder selected so that it can be cross-linked by radiation in situ, then a road with superior durability could be created using standard techniques for initial construction and subsequent pothole repair. Similarly, the ability to create high quality pothole repairs even under extreme winter conditions is a valuable capability for road repair crews.

The improvement in terms of durability and materials properties can be accomplished via in situ radiation induced cross-linking where the in situ radiation is provided via the mobile electron accelerator 62 as shown in FIG. 6. Note that a binding agent can be selected such that standard equipment is capable of being used during the forming (e.g., equipment to form standard asphalt) and may or may not include mixture of some or all bitumen. Such an approach is not limited to road construction, but can be adapted for use with any material that can benefit from being cross-linked in the field.

Based on the foregoing, it can be appreciated that a number of example embodiments, preferred and alternative, are disclosed herein. For example, in one embodiment, a system for treating and strengthening material can be implemented. Such a system can include a mobile unit and a plurality of electron accelerators integrated with the mobile unit, the plurality of electron accelerators positioned on the mobile unit to irradiate and treat in-situ. A material can be located proximate to the mobile unit, wherein irradiation of the material by the plurality of electron accelerators results in in-situ cross-linking of the material and therefore a strengthening and increased durability of the material.

In another embodiment, the material can include at least one of, for example, a polymer or a polymer composite, or a cross-link capable material or binder. In yet another embodiment, the aforementioned material can comprise, for example, at least one of: a bitumen or modified electron beam or an x-ray cross-link capable bitumen product. In still another embodiment, the aforementioned material can include at least one of, for example, asphalt, modified asphalt, or a cross-link capable binder-stone mixture of a road surface. In some embodiments, the mobile unit can be implemented as a vehicle-mounted unit that moves above and with respect to the road surface. In other embodiments, the mobile unit can be implemented as a vehicle-mounted unit solely for the purpose of providing deep heat allowing quality pothole repairs under extreme low temperature winter conditions.

In another embodiment, the aforementioned material can include at least one of, for example, plastic or plastic composite materials capable of being cross-linked or cured with Electron Beams or X-rays. In another embodiment, the irradiation of the material can include the in-situ cross-linking, curing, or a material properties modification of the material. In another embodiment, the mobile unit can be a unit that moves with respect to the material being treated.

In another embodiment, a system for treating and strengthening a road surface can be implemented. Such a system can include, for example, a mobile unit comprising a vehicle-mounted unit that moves above and with respect to a road surface, and a plurality of electron accelerators integrated with the mobile unit, the plurality of electron accelerators positioned on the mobile unit to irradiate and treat in-situ, a material comprising at least one of: asphalt, modified asphalt, or a cross-link capable binder-stone mixture of the road surface, the road surface located proximate to the mobile unit, wherein irradiation of the material by the plurality of electron accelerators results in in-situ cross-linking of the material and therefore a strengthening and increased durability of the material.

In still another embodiment, a method for treating and strengthening material can be implemented. Such a method can include, for example, the steps of logical operations of integrating a plurality of electron accelerators with a mobile unit, and positioning the plurality of electron accelerators on the mobile unit to irradiate and treat in-situ, a material located proximate to the mobile unit, wherein irradiation of the material by the plurality of electron accelerators results in in-situ cross-linking of the material and therefore a strengthening and increased durability of the material.

In another embodiment, a system for treating and strengthening a material filling a pothole comprises a mobile unit; at least one electron gun that emits a beam of electrons; at least one electron accelerator integrated with the mobile unit and positioned to accelerate the beam of electrons; and at least one beam extraction device comprising a scan coil that emits the accelerated beam of electrons, the at least one beam extraction device positioned on the mobile unit to irradiate the surface of and treat in-situ, the material filling the pothole, wherein irradiation of the material filling the pothole by the beam of electrons results in in-situ cross-linking of the material filling the pothole and therefore a strengthening and increased durability of the material filling the pothole.

In another embodiment, the mobile unit comprises a vehicle-mounted unit that moves above and with respect to the road surface with the pothole. The irradiation of the material filling the pothole induces the in-situ cross-linking, curing, or a material properties modification of the material filling the pothole. The mobile unit comprises a unit that moves with respect to the material filling the pothole that is being treated.

In another embodiment, irradiation of the base material serves to provide heating to bring the bulk temperature of the base material to a normal working temperature several centimeter deep into the material promoting workability and a good patch bond even under extreme winter cold temperatures.

In yet another embodiment, a system for filling a pothole comprises a mobile unit comprising a vehicle-mounted unit that moves above and with respect to a pothole filled with a material in a road surface; at least one electron gun that emits a beam of electrons; at least one electron accelerator integrated with the mobile unit and positioned to accelerate the beam of electrons; and at least one beam extraction device comprising a scan coil that emits the accelerated beam of electrons, the at least one beam extraction device positioned on the mobile unit to irradiate and treat in-situ, the material filling the pothole in the road surface, the material comprising at least one of asphalt, modified asphalt, or a cross-link capable binder-stone mixture, wherein irradiation of the material filling the pothole in the road surface by the beam of electrons results in in-situ cross-linking of the material filling the pothole and therefore a strengthening and increased durability of the material filling the pothole in the road surface.

In another embodiment of the system, the irradiation of the material filling the pothole induces the in-situ cross-linking or curing of the material filling the pothole.

In yet another embodiment, a method for treating and strengthening material comprising fill material for a pothole comprises integrating a plurality of electron accelerators with a mobile unit; and positioning the plurality of electron accelerators on the mobile unit to irradiate the surface of and treat in-situ, the material filling the pothole, wherein the pothole is located proximate to the mobile unit, wherein the material filling the pothole is cross-linkable, wherein irradiation of the material filling the pothole by the plurality of electron accelerators results in in-situ cross-linking of the material filling the pothole and therefore a strengthening and increased durability of the material filling the pothole.

In another embodiment of the method, the mobile unit comprises a vehicle-mounted unit that moves above and with respect to the road surface with the pothole.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art, which are also intended to be encompassed by the following claims.

What is claimed is:

1. A system for treating and strengthening a material filling a pothole, said system comprising:
    a mobile unit;
    at least one electron gun that emits a beam of electrons;
    at least one electron accelerator integrated with the mobile unit and positioned to accelerate the beam of electrons; and
    at least one beam extraction device comprising a scan coil that emits the accelerated beam of electrons, the at least one beam extraction device positioned on the mobile unit to irradiate the surface of and treat in-situ, the material filling the pothole, wherein irradiation of the material filling the pothole by the beam of electrons results in in-situ cross-linking of the material filling the pothole and therefore a strengthening and increased durability of the material filling the pothole.

2. The system of claim 1 wherein the mobile unit comprises a vehicle-mounted unit that moves above and with respect to the road surface with the pothole.

3. The system of claim 1 wherein the irradiation of the material filling the pothole induces the in-situ cross-linking, curing, or a material properties modification of the material filling the pothole.

4. The system of claim 1 wherein the accelerated beam of electrons heats the base material to a normal working temperature thereby promoting workability and a good patch bond.

5. The system of claim 1 wherein the mobile unit comprises a unit that moves with respect to the material filling the pothole that is being treated.

6. A system for filling a pothole, the system comprising:
    a mobile unit comprising a vehicle-mounted unit that moves above and with respect to a pothole filled with a material in a road surface;
    at least one electron gun that emits a beam of electrons;
    at least one electron accelerator integrated with the mobile unit and positioned to accelerate the beam of electrons; and
    at least one beam extraction device comprising a scan coil that emits the accelerated beam of electrons, the at least one beam extraction device positioned on the mobile unit to irradiate and treat in-situ, the material filling the pothole in the road surface, the material comprising at least one of: asphalt, modified asphalt, or a cross-link capable binder-stone mixture, wherein irradiation of the material filling the pothole in the road surface by the beam of electrons results in in-situ cross-linking of the material filling the pothole and therefore a strengthening and increased durability of the material filling the pothole in the road surface.

7. The system of claim 6 wherein the irradiation of the material filling the pothole induces the in-situ cross-linking or curing of the material filling the pothole.

8. A method for treating and strengthening material comprising fill material for a pothole, the method comprising:
    integrating a plurality of electron accelerators with a mobile unit; and
    positioning the plurality of electron accelerators on the mobile unit to irradiate the surface of and treat in-situ, the material filling the pothole, wherein the pothole is located proximate to the mobile unit, wherein the material filling the pothole is cross-linkable, wherein irradiation of the material filling the pothole by the plurality of electron accelerators results in in-situ cross-linking of the material filling the pothole and therefore a strengthening and increased durability of the material filling the pothole.

9. The method of claim 8 wherein the mobile unit comprises a vehicle-mounted unit that moves above and with respect to the road surface with the pothole.

* * * * *